(12) United States Patent
Choi

(10) Patent No.: US 8,130,561 B2
(45) Date of Patent: Mar. 6, 2012

(54) SELF PRE-CHARGING AND EQUALIZING BIT LINE SENSE AMPLIFIER

(75) Inventor: Young-Don Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 242 days.

(21) Appl. No.: 12/386,819

(22) Filed: Apr. 23, 2009

(65) Prior Publication Data

US 2009/0285032 A1    Nov. 19, 2009

(30) Foreign Application Priority Data

May 15, 2008    (KR) .................. 10-2008-0045006

(51) Int. Cl.
*G11C 7/00* (2006.01)
*G11C 7/06* (2006.01)

(52) U.S. Cl. .............. 365/189.05; 365/203; 365/189.09; 365/207

(58) Field of Classification Search ............. 365/189.05, 365/203, 189.09, 207
See application file for complete search history.

(56) References Cited

U.S. PATENT DOCUMENTS

| | | | |
|---|---|---|---|
| 5,327,379 A * | 7/1994 | Pascucci ...................... 365/190 |
| 5,375,084 A * | 12/1994 | Begun et al. ................. 365/63 |
| 5,646,899 A | 7/1997 | Jang et al. .................... 365/205 |
| 5,701,268 A | 12/1997 | Lee et al. ..................... 365/205 |
| 5,781,483 A | 7/1998 | Shore ........................... 365/200 |
| 6,320,798 B1 | 11/2001 | Jo et al. ..................... 365/189.11 |
| 6,400,629 B1 | 6/2002 | Barth, Jr. et al. ............. 365/210 |
| 6,434,069 B1 | 8/2002 | Heightley et al. ............ 365/203 |
| 6,661,714 B2 | 12/2003 | Lee ........................... 365/189.11 |
| 6,711,079 B2 * | 3/2004 | Kang ............................ 365/207 |
| 6,859,405 B2 | 2/2005 | Lee et al. ..................... 365/205 |
| 7,200,053 B2 | 4/2007 | Kim et al. ................. 365/189.11 |
| 7,200,062 B2 | 4/2007 | Kinsely et al. ................ 365/222 |
| 2007/0030748 A1 | 2/2007 | Byun et al. |
| 2007/0091686 A1 | 4/2007 | Won |
| 2009/0129135 A1 * | 5/2009 | Choi ............................ 365/51 |

FOREIGN PATENT DOCUMENTS

KR    10-2007-0117926    * 11/2007

* cited by examiner

*Primary Examiner* — Hoai V Ho
*Assistant Examiner* — James G Norman
(74) *Attorney, Agent, or Firm* — Monica H. Choi

(57) ABSTRACT

A bit-line sense amplifier includes a latching unit and a control unit. The latching unit has a plurality of field effect transistors coupled between first and second bit lines. The control unit controls application of a bias voltage to a set of the field effect transistors such that respective pre-charge voltages are generated at the first and second bit lines with drain currents flowing in the field effect transistors during a pre-charge time period, without a bit line bias voltage and with a minimized number of transistors.

48 Claims, 10 Drawing Sheets

| Time Period | PEQI | LANG | Operation |
|---|---|---|---|
| TP1 (Self Pre-charge) | (High) | (High) | BL and BLB charge to meta-point. |
| TP2 (Equalization) | (High) | (Low) | BL and BLB move along line with slope = 1. |
| TP3 (Floating) | (Low) | (Low) | BL and BLB move along line with same slope as meta-line. |
| TP4 (Charge Sharing) | (Low) | (Low) | BL and BLB move according to charge sharing and PMOSFET action to one side of meta-line. |
| TP5 (Develop) | (Low) | (High) | BL and BLB move to one of (0, VDD) or (VDD, 0) depending on which side of meta-line you were at by end of T4. |

*FIG. 6*

|  | [mV] | min | max | range |
|---|---|---|---|---|
| Conventional | ΔVTN | -40 | +36 | 76 |
|  | ΔVTP | <-100 | >+100 | >200 |
| BLSA of FIG. 3 | ΔVTN | -48 | +72 | 120 |
|  | ΔVTP | -82 | +44 | 126 |

SELF PRE-CHARGING AND EQUALIZING BIT LINE SENSE AMPLIFIER

CROSS-REFERENCE TO RELATED APPLICATION(S)

The present application claims priority under 35 U.S.C. §119 to Korean Patent Application No. 2008-45006, filed on May 15, 2008, which is incorporated herein by reference in its entirety.

TECHNICAL FIELD

The present invention relates generally to a bit line sense amplifier of a memory device, and more particularly, to a bit line sense amplifier having efficient operation with low voltage and reduced number of transistors.

BACKGROUND OF THE INVENTION

A bit line sense amplifier is commonly used in a memory device such as a flash memory device for determining bit data stored in a memory cell. FIG. 1 shows an example prior art bit line sense amplifier (BLSA) 100 as disclosed in U.S. Pat. No. 5,701,268 to Lee et al.

The BLSA 100 includes first and second PMOSFETs (P-channel metal oxide semiconductor field effect transistors) MP1 and MP2 and first and second NMOSFETs (N-channel metal oxide semiconductor field effect transistors) MN1 and MN2, connected to form a latch. The drains of the PMOSFET MP1 and the NMOSFET MN1 are connected together at a bit line BL, and the drains of the PMOSFET MP2 and the NMOSFET MN2 are connected together at a complementary bit line BLB.

The sources of the PMOSFETs MP1 and MP2 are connected together at a first biased node LA, and the sources of the NMOSFETs MN1 and MN2 are connected together at a second biased node LAB. The gates of the PMOSFET MP1 and the NMOSFET MN1 are connected together to the complementary bit line BLB. The gates of the PMOSFET MP2 and the NMOSFET MN2 are connected together to the bit line BL.

A biasing PMOSFET MP3 is connected between a high voltage source providing a high voltage VINTA and the first biased node LA. The gate of the biasing PMOSFET MP3 is controlled by a high bias control signal LAPG. A biasing NMOSFET MN3 is connected between a low voltage source providing a low voltage VSSA such as a ground node and the second biased node LAB. The gate of the biasing NMOSFET MN3 is controlled by a low bias control signal LANG.

Further in the BLSA 100 of FIG. 1, NMOSFETs MN4, MN5, and MN6 are connected between the bit line BL and the complementary bit line BLB for pre-charging and equalizing such nodes BL and BLB. The drains of the NMOSFETs MN5 and MN6 are connected to a bit line bias voltage source providing a bit line voltage VBL. The source of the NMOSFET MN5 is connected to the bit line BL, and the source of the NMOSFET MN6 is connected to the complementary bit line BLB.

The drain of the NMOSFET MN4 is connected to the bit line BL, and the source of the NMOSFET MN4 is connected to the complementary bit line BLB. The gates of the NMOSFETs MN4, MN5, and MN6 are controlled by a pre-charge and equalization control signal PEQI. The NMOSFETs MN4, MN5, and MN6 are turned on for simultaneously pre-charging and equalizing the bit line BL and the complementary bit line BLB to the bit line voltage VBL.

In the BLSA 100, the first biased node LA is floating with no current flowing through such a node LA in a non-access mode when a memory cell is not being accessed by being connected to the bit line BL. However, noise at the bit line BL may turn on the NMOSFET MN2 to lower the voltage at the second biased node LAB. Such a voltage change may disadvantageously result in inaccurate sensing at the bit line BL and the complementary bit line BLB.

FIG. 2 shows another example prior art bit line sense amplifier (BLSA) 102 as disclosed in U.S. Pat. No. 6,859,405 to Lee et al. The BLSA 102 of FIG. 2 includes the PMOSFETs MP1 and MP2 and the NMOSFETs MN1 and MN2 connected to each-other as a latch similarly as described in reference to FIG. 1. In addition, the BLSA 102 also includes the biasing PMOSFET MP3 and the biasing NMOSFET MN3 similarly configured as described in reference to FIG. 1.

However in contrast to FIG. 1, the BLSA 102 of FIG. 2 includes NMOSFETs MN7, MN8, and MN9 connected between the first and second biased nodes LA and LAB for pre-charging and equalizing the bit line BL and the complementary bit line BLB. The NMOSFETs MN7, MN8, and MN9 are turned on for simultaneously pre-charging and equalizing the first and second biased nodes LA and LAB to the bit line voltage VBL.

The BLSA 102 includes four MOSFETs MP3, MN8, MN9, and MN3 between the high and low voltages VINTA and VSSA. Thus with a low voltage range between VINTA and VSSA, the BLSA 102 may not operate with high speed. In addition, the bit line voltage VBL may deviate from a desired level of ½ VDD resulting in incorrect sensing at the bit line BL and the complementary bit line BLB. Furthermore, the speed and accuracy of operation of the BLSA 102 may also be disadvantageously influenced by use of the high and low bias control signals LAPG and LANG.

SUMMARY OF THE INVENTION

Accordingly, a bit line sense amplifier of embodiments of the present invention is formed to have high-speed and accurate operation with low voltage and reduced number of transistors.

In a general aspect of the present invention, a bit-line sense amplifier includes a latching unit and a control unit. The latching unit has a plurality of field effect transistors coupled between first and second bit lines. The control unit controls application of a bias voltage to a set of the field effect transistors such that respective pre-charge voltages are generated at the first and second bit lines with drain currents flowing in the field effect transistors during a pre-charge time period.

In an example embodiment of the present invention, the pre-charge time period is before sensing charge from a memory cell at one of the first and second bit lines.

In another embodiment of the present invention, the respective pre-charge voltages are generated at the first and second bit lines with only high and low bias voltages applied at sources of the field effect transistors of the latching unit and without any bit-line voltage from any bit-line voltage source applied at the first and second bit lines.

In a further embodiment of the present invention, the bit-line sense amplifier further includes a bias switch coupled between a bias voltage source generating the bias voltage and sources of two of the field effect transistors. The control unit controls the bias switch to be closed for having the bias voltage applied at the sources of the two field effect transistors during the pre-charge time period.

In an example embodiment of the present invention, the bias switch is comprised of only one field effect transistor having a gate controlled by the control unit. For example, the bias voltage is a low bias voltage applied on the sources of the two field effect transistors that are NMOSFETs (N-channel metal oxide semiconductor field effect transistors) through the bias switch.

In a further embodiment of the present invention, a high bias voltage source is directly connected to sources of two PMOSFETs (P-channel metal oxide semiconductor field effect transistors) of the latching unit. The control unit controls application of a bias control signal on a gate of the bias switch.

In another embodiment of the present invention, the bit-line sense amplifier further includes an equalization switch coupled between the first and second bit lines. The control unit controls the equalization switch to be closed between the first and second bit lines during the pre-charge time period. In an example embodiment of the present invention, the equalization switch is comprised of only one field effect transistor having a gate controlled by the control unit.

In a further embodiment of the present invention, the control unit controls the bias switch to be opened and the equalization switch to be closed during an equalization time period for generating respective equalized voltages at the first and second bit lines after the pre-charge time period. In another embodiment of the present invention, the equalized voltages are limited by gate-to-source voltages of another set of the field effect transistors forming the latching unit.

In an example embodiment of the present invention, the control unit controls the bias switch to be opened and the equalization switch to be opened during a floating time period after the equalization time period and before sensing charge from a memory cell at the first and second bit lines. The control unit controls the bias switch to be opened and the equalization switch to be opened during a charge sharing time period for coupling of at least one memory cell to at least one of the first and second bit lines after the floating time period.

In addition, the control unit controls the bias switch to be closed and the equalization switch to be opened during a developing time period for generating data signals on the first and second bit lines after the charge sharing time period.

In a further embodiment of the present invention, the bit-line sense amplifier has a state diagram with a meta-point and a meta-line. The meta-point determines the respective pre-charge voltages, and the meta-line determines respective voltages at the bit lines during the floating time period.

In another aspect of the present invention, the bit-line sense amplifier is formed in a memory device including a memory cell array having a memory cell coupled to at least one of the first and second bit lines. For example, the memory device includes a decoder having the control unit formed therein with the decoder determining a memory cell to be coupled to one of the first and second bit lines from an address. In that case, the pre-charge time period is before sensing charge from the memory cell at one of the first and second bit lines. The memory cell is decoupled from the first and second bit lines during the pre-charge time period.

In a further aspect of the present invention, the memory device is formed as an integrated circuit on a semiconductor wafer.

In another aspect of the present invention, the memory device is formed in an electronic system including an input device, an output device, and a processor device coupled to the input device, the output device, and the memory device.

In this manner, the bit lines are pre-charged with current flowing through the field effect transistors of the latching unit for self pre-charge without a bit line bias voltage. In addition, fewer field effect transistors are connected between the high and low bias voltages for high speed operation with low voltage. Furthermore, the PMOSFETs of the latching unit are directly connected to the high bias voltage source for reduced number of control field effect transistors and control signals. Additionally, the bit lines are charged along the meta-line of the bit line sense amplifier during the floating time period for enhanced sensitivity.

These and other features and advantages of the present invention will be better understood by considering the following detailed description of the invention which is presented with the attached drawings.

BRIEF DESCRIPTION OF THE DRAWINGS

FIG. 6 shows a table of five time periods for different states during operation of the bit line sense amplifier of FIG. 3, according to an embodiment of the present invention;

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, and 16 refer to elements having similar structure and/or function, unless stated other-wise.

DETAILED DESCRIPTION

Figure 3:
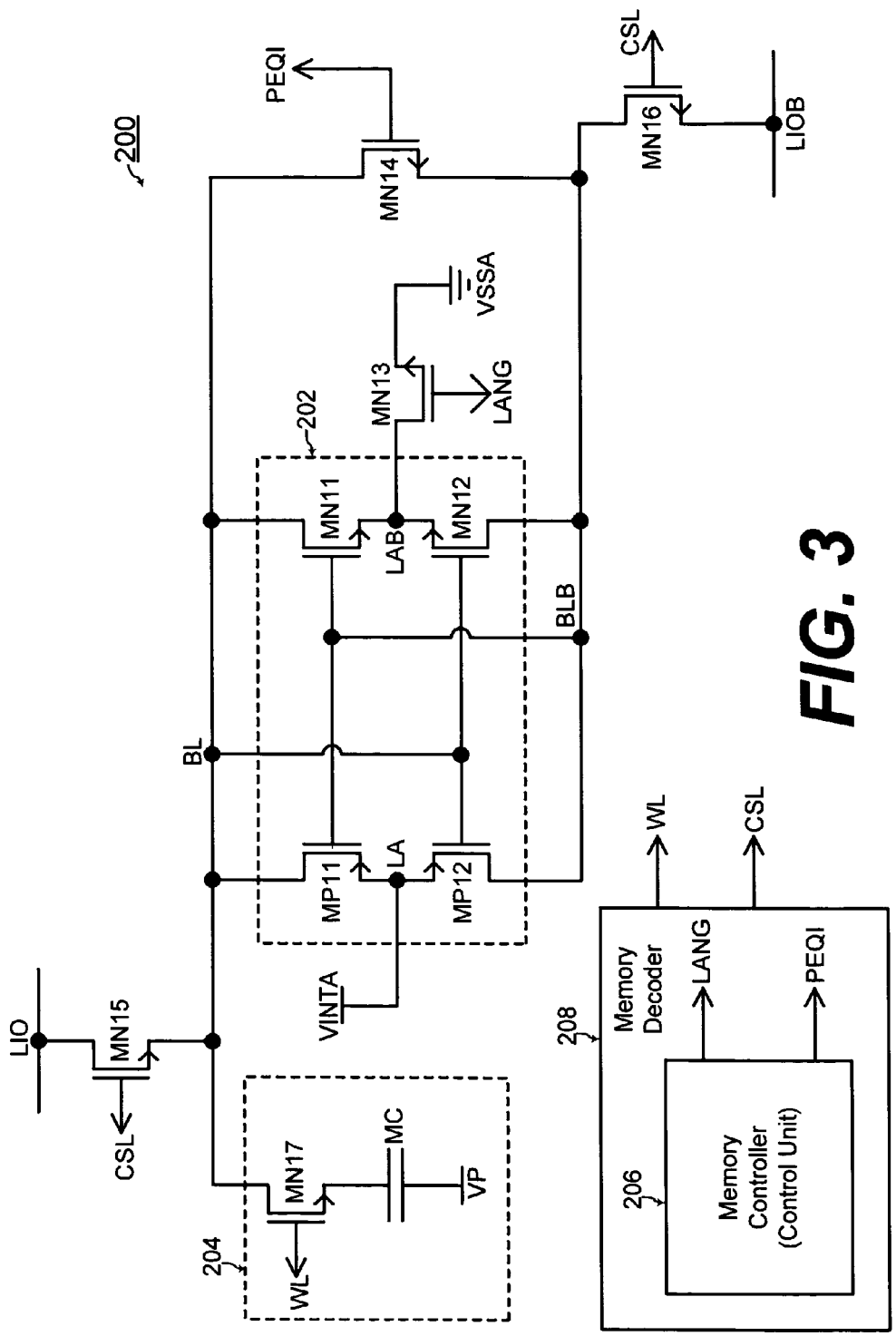
FIG. 3 shows a circuit diagram of a bit line sense amplifier operating with high-speed, accuracy, low voltage, and reduced number of transistors, according to an embodiment of the present invention.

FIG. 3 shows a circuit diagram of a bit line sense amplifier (BLSA) 200 operating with high-speed, accuracy, low voltage, and reduced number of transistors, according to an embodiment of the present invention. The BLSA 200 includes first and second PMOSFETs (P-channel metal oxide semiconductor field effect transistors) MP11 and MP12 and first and second NMOSFETs (N-channel metal oxide semiconductor field effect transistors) MN11 and MN12, connected to form a latching unit 202.

Thus, the drains of the PMOSFET MP11 and the NMOSFET MN11 are connected together at a first bit line BL. The drains of the PMOSFET MP12 and the NMOSFET MN12 are connected together at a second bit line BLB. A respective voltage generated at the first bit line BL is complementary to a respective voltage generated at the second bit line BLB.

The sources of the PMOSFETs MP11 and MP12 are connected together at a first biased node LA, and the sources of the NMOSFETs MN11 and MN12 are connected together at a second biased node LAB. The gates of the PMOSFET MP11 and the NMOSFET MN11 are connected together to the second bit line BLB. The gates of the PMOSFET MP12 and the NMOSFET MN12 are connected together to the first bit line BL.

A high bias voltage source providing a high bias voltage VINTA is connected to the sources of the PMOSFETs MP11 and MP12 at the first biased node LA. A biasing NMOSFET MN13 (i.e., a biasing switch) is connected between the second biased node LAB and a low bias voltage source providing a low bias voltage VSSA such as a ground node.

The sources of the NMOSFETs MN11 and MN12 are connected to the drain of the biasing NMOSFET MN13 at the second biased node LAB. The source of the biasing NMOSFET MN13 is connected to the low bias voltage source providing the low bias voltage VSSA. The gate of the biasing NMOSFET MN3 is controlled by a low bias control signal LANG.

Further in the BLSA 200 of FIG. 3, an NMOSFET MN14 is connected as an equalization switch between the first and second bit lines BL and BLB. The drain of the NMOSFET MN14 is connected to the first bit line BL, and the source of the NMOSFET MN14 is connected to the second bit line BLB. The gate of the NMOSFET MN14 is controlled by an equalization control signal PEQI.

Further in the BLSA 200 of FIG. 3, a memory cell array 204 including an example memory cell MC is coupled to the first bit line BL. A transmitting NMOSFET MN17 is coupled between the first bit line BL and the memory cell MC. The gate of the transmitting NMOSFET MN17 is controlled by a word line control signal WL. The drain of the transmitting NMOSFET MN17 is connected to the first bit line BL, and the source of the transmitting NMOSFET MN17 is connected to a first node of the memory cell MC also having a second node connected to a memory cell voltage source providing a memory cell bias voltage VP.

Also in the BLSA 200 of FIG. 3, a first column select NMOSFET MN15 is connected between the first bit line BL and a first local I/O (input/output) line LIO, and a second column select NMOSFET MN16 is connected between the second bit line BLB and a second local I/O (input/output) line LIOB.

The gates of the column select NMOSFETs MN15 and MN16 are controlled by a column select control signal CSL generated by a memory decoder 208. The column select NMOSFETs MN15 and MN16 are turned on by the column select control signal CSL to couple the bit lines BL and BLB to the local I/O lines LIO and LIOB, respectively when the memory cell MC is selected to be accessed by the memory decoder 208 from an address. The memory decoder 208 decodes an address to generate CSL and WL for selecting the respective memory cell corresponding to the address to be sensed by the BLSA 200.

The BLSA 200 of FIG. 3 also includes a memory controller (i.e., a control unit) 206 that may be part of a memory decoder 208 for generating the low bias control signal LANG and the equalization control signal PEQI. The memory controller 206 generates the low bias control signal LANG and the equalization control signal PEQI according to the timing diagram of FIG. 4 during operation of the BLSA 200 of FIG. 3.

Figure 5:
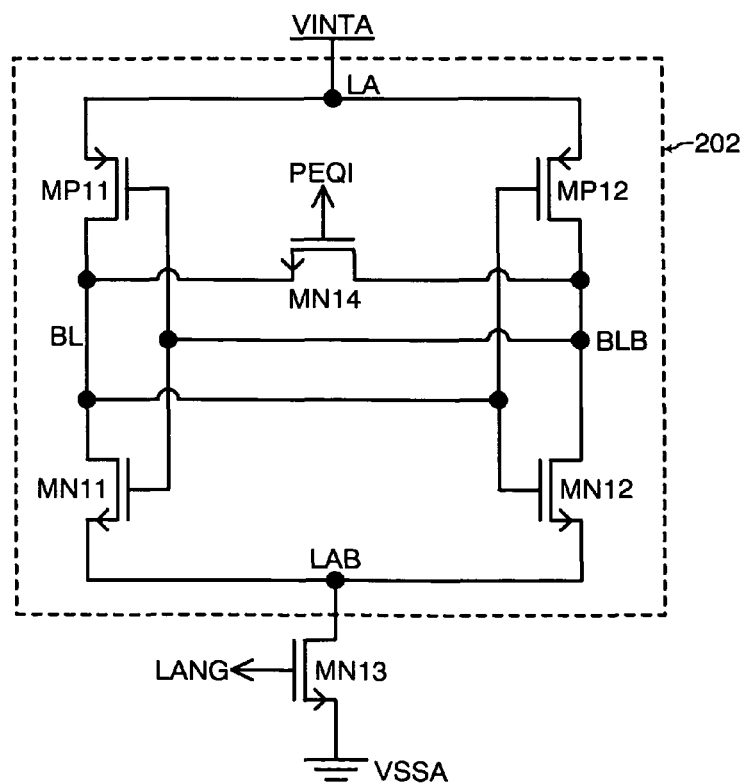
FIG. 5 shows a circuit diagram of a latching unit in the bit line sense amplifier of FIG. 3, according to an embodiment of the present invention.

FIG. 5 shows the circuit diagram of the PMOSFETs MP11 and MP12 and the NMOSFETs MN11 and MN12 in the latching unit 202 of FIG. 3 with the biasing NMOSFET MN13. FIG. 6 shows a table of states during operation of the BLSA 200 of FIG. 3.

Referring to FIGS. 3, 4, 5, and 6, the memory controller 206 generates the equalization control signal PEQI to be at the logical high state (H) and the low bias control signal LANG to be at the logical high state (H), during a self pre-charge time period TP1. In that case, the first and second bit lines BL and BLB charge to a meta-point voltage MP of the BLSA 200. Such a meta-point voltage MP is a respective pre-charge voltage generated at each of the bit lines BL and BLB during the self pre-charge time period TP1.

Figure 7:
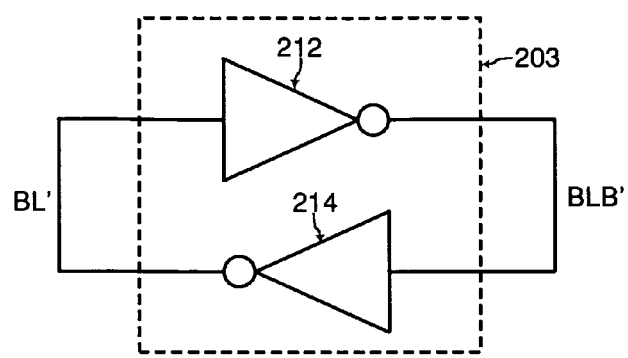
FIGS. 7 and 8 illustrate formation of a meta-point and a meta-line for an example latch, according to an embodiment of the present invention.
Figure 8:
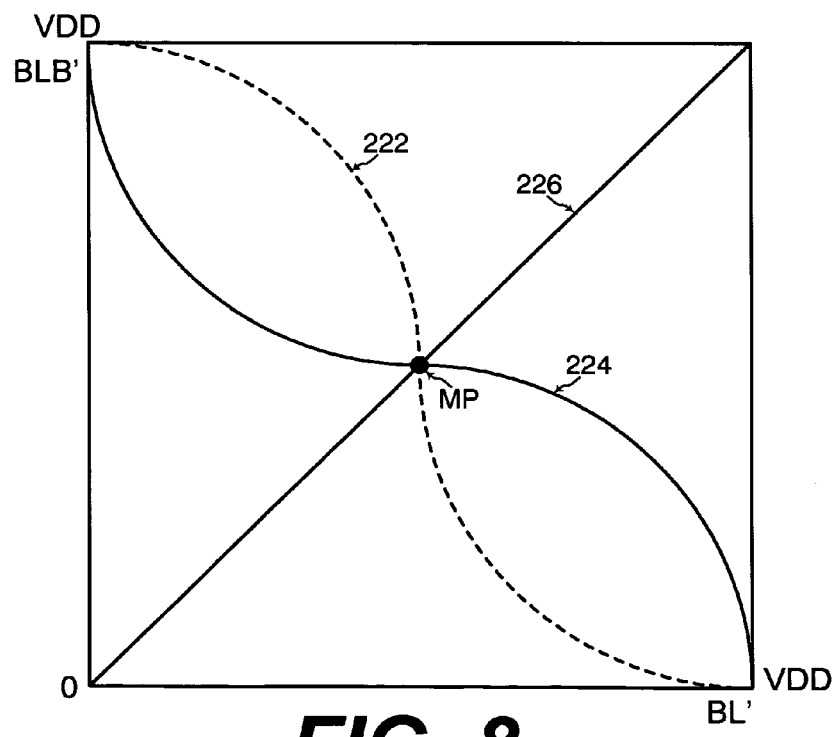

FIGS. 7 and 8 illustrate the meta-point MP corresponding to an example simple latching unit 203. FIG. 7 shows a first inverter 212 and a second inverter 214 configured as the latch 203 between a bit line BL' and a complementary bit line BLB'. FIG. 8 shows a state diagram with respective DC transfer curves for the inverters 212 and 214. The X-axis in FIG. 8 is the voltage at the bit line BL', and the Y-axis in FIG. 8 is the voltage at the complementary bit line BLB'.

FIG. 8 includes a first DC transfer curve 222 for the first inverter 212 which is a plot of the resulting voltage at the complementary bit line BLB' in response to the voltage applied at the bit line BL'. FIG. 8 also includes a second DC transfer curve 224 for the second inverter 214 which is a plot of the resulting voltage at the bit line BL' in response to the voltage applied at the complementary bit line BLB'.

The meta-point MP is the point where the first and second DC transfer curves 222 and 224 intersect to be equal. A meta-line 226 indicates a border between the two resulting voltages at the bit lines BL' and BLB' depending on initial voltages at the bit lines BL' and BLB' of FIG. 7.

If the initial voltages at the bit lines BL' and BLB' are below the meta-line 226, the resulting voltage at the bit line BL' is VDD (i.e., logical high state) and the resulting voltage the complementary bit line BLB' is 0 (i.e., logical low state). If the initial voltages at the bit lines BL' and BLB' are above the meta-line 226, the resulting voltage at the bit line BL' is 0 (i.e., logical low state) and the resulting voltage the complementary bit line BLB' is VDD (i.e., logical high state). In the case of perfect matching between the inverters 212 and 214 in FIG. 7, the meta-point MP is at ½ VDD and the meta-line 226 has a slope of 1.

The BLSA 200 of FIG. 3 similarly has a meta-point and a meta-line similar to FIG. 8 but determined by device characteristics of the MOSFETs MP11, MP12, MN11, MN12, MN13, and MN14. Typically, the meta-point MP for the BLSA 200 of FIG. 3 may be deviated from ½ VDD depending on device characteristics of the MOSFETs MP11, MP12, MN11, MN12, MN13, and MN14. In addition, the meta-line for the BLSA 200 of FIG. 3 has a slope that may be deviated from 1 depending on mismatch between the first and second bit lines BL and BLB.

Figure 11:
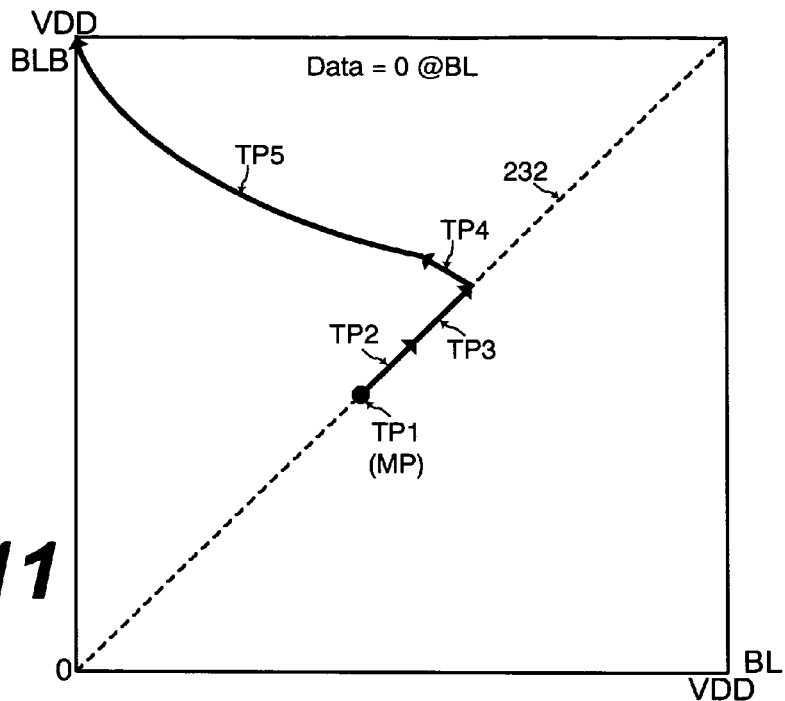
FIGS. 11, 12, 13, and 14 show state-diagrams with change of voltages at the bit lines during operation of the bit line sense amplifier of FIG. 3, according to an embodiment of the present invention.

FIG. 11 shows an example state diagram for the BLSA 200 of FIG. 3 for the case of the respective loadings at the first and second bit lines BL and BLB being ideally matched. In that case, a meta-line 232 of the BLSA 200 of FIG. 3 has a slope of 1. Referring to FIGS. 3, 4, 5, 6, and 11, the respective voltages at the first and second bit lines BL and BLB charge to the meta-point voltage MP in the state diagram of FIG. 11 during the self pre-charge time period TP1.

During the self pre-charge period TP1, the biasing NMOSFET MN13 and the equalization NMOSFET MN14 are turned on. In that case, the high bias voltage VINTA is applied at the sources of the PMOSFETs MP11 and MP12, and the low bias voltage VSSA is applied at the sources of the NMOSFETs MN11 and MN12. Thus, the PMOSFETs MP11 and MP12 and the NMOSFETs MN11 and MN12 of the latching unit 202 conduct respective drain currents during the self pre-charge time period TP1.

In addition, the bit lines BL and BLB are coupled together through the equalization NMOSFET MN14. The NMOSFETs MN15 MN16, and MN17 are turned off during the self pre-charge time period TP1.

Referring to FIGS. 3, 4, 5, 6, and 11, the memory controller 206 generates the equalization control signal PEQI to be at the logical high state (H) and the low bias control signal LANG to be at the logical low state (L), during an equalization time period TP2 after the self pre-charge time period TP1. During the equalization time period TP2, the biasing NMOSFET MN13 is turned off while the equalization NMOSFET MN14 is turned on.

In that case, the high bias voltage VINTA is still applied at the sources of the PMOSFETs MP11 and MP12 such that the respective voltages at the bit lines BL and BLB increase from the meta-point MP along a line with slope of 1 to equalized voltages (shown by the arrowed line labeled TP2 in FIG. 11). The respective voltages at the bit lines BL and BLB increase along a line with slope of 1 during the equalization time period TP2 because the bit lines BL and BLB are coupled together by the equalization NMOSFET MN14.

The respective equalized voltages reached at the bit lines BL and BLB during the equalization time period TP2 typically do not reach the high bias voltage VINTA from being limited by the gate to source voltages of the PMOSFETs MP11 and MP12. The NMOSFETs MN15, MN16, and MN17 are turned off during the equalization time period TP2.

Further referring to FIGS. 3, 4, 5, 6, and 11, the memory controller 206 generates the equalization control signal PEQI to be at the logical low state (L) and the low bias control signal LANG to be at the logical low state (L), during a floating time period TP3 after the equalization time period TP2. During the floating time period TP3, the biasing NMOSFET MN13 and the equalization NMOSFET MN14 are turned off. The NMOSFETs MN15, MN16, and MN17 are turned off during the floating time period TP3. In that case, the respective voltages at the bit lines BL and BLB increase along a line having a same slope as the meta-line 232 (shown by the arrowed line labeled TP3 in FIG. 11).

Thereafter referring to FIGS. 3, 4, 5, 6, and 11, the memory controller 206 generates the equalization control signal PEQI to be at the logical low state (L) and the low bias control signal LANG to be at the logical low state (L), during a charge sharing time period TP4 after the floating time period TP3. During the charge sharing time period TP4, the biasing NMOSFET MN13 and the equalization NMOSFET MN14 are turned off, and the NMOSFETs MN15 and MN16 are turned off.

However, the NMOSFET MN17 is turned on to couple the charge from the memory cell MC to the bit line BL such that the BLSA 200 senses charge from the memory cell MC during the charge sharing time period TP4. In that case during the charge sharing time period TP4, the respective voltages at the bit lines BL and BLB are modified according to the amount of charge transferred from the memory cell MC to the bit line BL (shown by the arrowed line labeled TP4 in FIG. 11).

Referring to FIG. 11, the respective voltage at the first bit line BL decreases from the MC storing the 0 (i.e., logical low) data bit during the charge sharing time period TP4. However, the respective voltage at the second bit line BLB increases since the PMOSFET MP12 is further turned on to charge up the second bit line BLB. Such increase of the respective voltage at the second bit line BLB during the charge sharing time period TP4 is referred to as "PMOSFET action". This PMOSFET action increases ΔVBL (i.e., the difference between the voltages at the bit lines BL and BLB) by the end of the charge sharing time period TP4 resulting in faster operating speed of the BLSA 200.

Subsequently referring to FIGS. 3, 4, 5, 6, and 11, the memory controller 206 generates the equalization control signal PEQI to be at the logical low state (L) and the low bias control signal LANG to be at the logical high state (H), during a develop time period TP5 after the charge sharing time period TP4. During the develop time period TP5, the biasing NMOSFET MN13 is turned on while the equalization NMOSFET MN14 and the NMOSFETs MN15, MN16, and MN17 are turned off.

During the develop time period TP5, the respective voltages at the bit lines BL and BLB move to one of the corners in the state diagram of FIG. 11 to generate data signals depending on which side of the meta-line 232 the respective voltages at the bit lines BL and BLB were at the end of the charge sharing time period TP4. Since the respective voltages at the bit lines BL and BLB are above the meta-line 232 at the end of the charge sharing time period TP4 (end of arrow labeled TP4 in FIG. 11), the voltage at the first bit line BL is at 0 (i.e., logical low state), and the voltage at the second bit line BLB is at VDD (i.e., logical high state). In this manner, the bit lines BL and BLB generate respective data signals at the end of the develop time period TP5.

Figure 12:
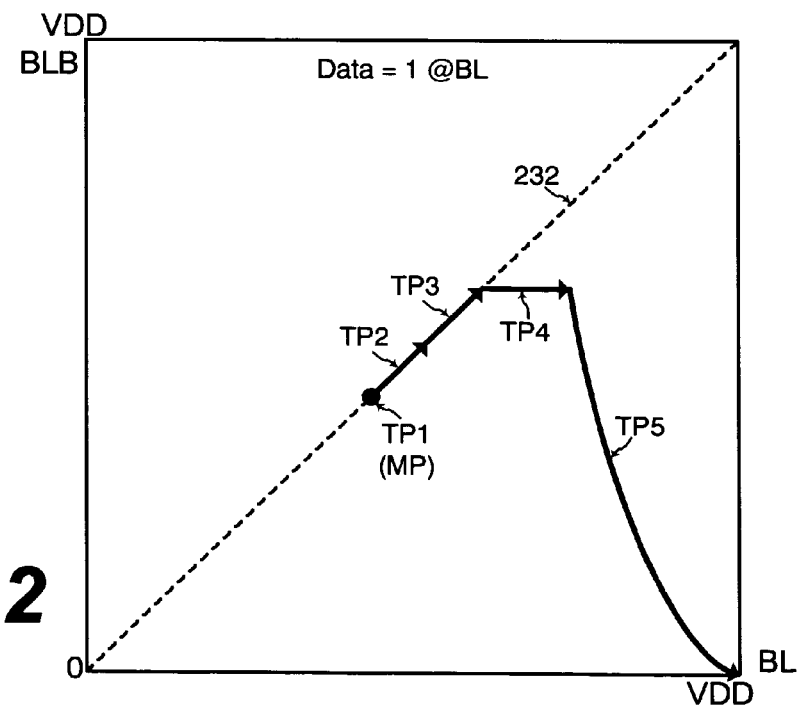

FIG. 11 illustrates a state diagram for the case of the memory cell MC storing a 0 (i.e., logical low) bit data. FIG. 12 illustrates a state diagram for the case of the memory cell MC storing a 1 (i.e., logical high) bit data. In that case, the voltages at the bit lines BL and BLB are similarly developed in FIGS. 11 and 12 at the end of the self pre-charge time period TP1, the equalization time period TP2, and the floating time period TP3.

During the charge sharing time period TP4 in FIG. 12, the voltage at the first bit line BL increases (arrow labeled TP4 in FIG. 12) from the charge transferred from the memory cell MC. However, the voltage at the second bit line BLB in FIG. 12 does not increase (arrow labeled TP4 in FIG. 12) because the PMOSFET MP12 remains turned off with development of the higher voltage at the bit line BL.

Accordingly, the respective voltages at the bit lines BL and BLB are below the meta-line 232 at the end of the charge sharing time period TP4 (end of arrow labeled TP4 in FIG. 12). Subsequently during the develop time period TP5 in FIG. 12, the voltage at the first bit line BL is at VDD (i.e., logical high state), and the voltage at the second bit line BLB is at 0 (i.e., logical low state). In this manner, the bit lines BL and BLB generate respective data signals at the end of the develop time period TP5.

Figures 9, 10:
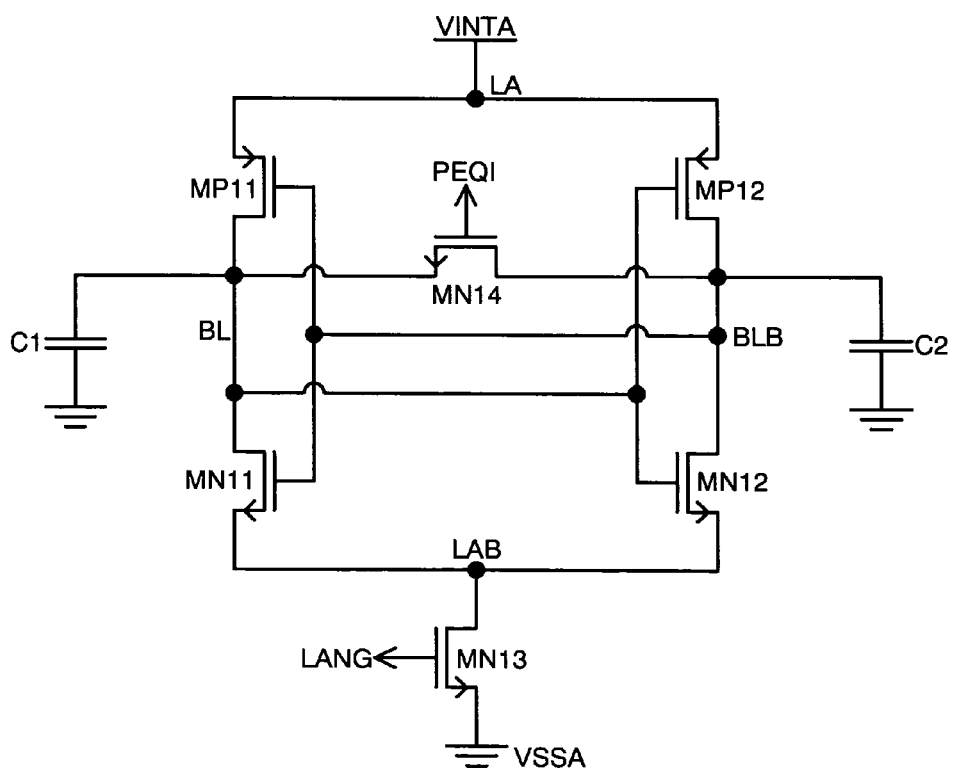
FIG. 9 shows a table of acceptable ranges of threshold voltage variations for the field effect transistors in the latching unit of the bit line sense amplifier of FIG. 3, according to an embodiment of the present invention.
FIG. 10 shows a circuit diagram of the latching unit in the bit line sense amplifier of FIG. 3 with unbalanced loads, according to an embodiment of the present invention.

FIG. 9 shows a table of acceptable range of threshold voltage mismatches in the latching unit 202 of the BLSA 200 of FIG. 3. In FIG. 9, ΔVTN is the mismatch between the threshold voltages of the NMOSFETs MN11 and MN12, and ΔVTP is the mismatch between the threshold voltages of the PMOSFETs MP11 and MP12.

Figure 1:
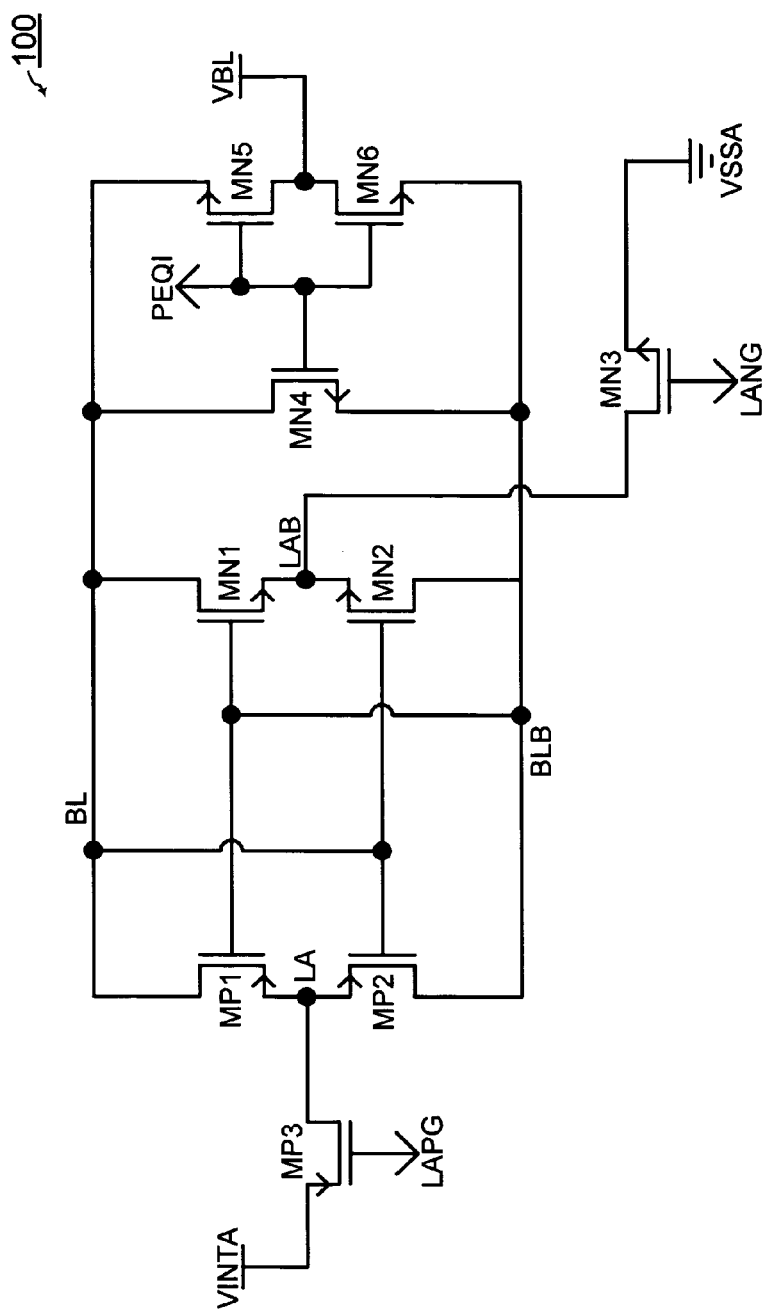
FIG. 1 shows a circuit diagram of a bit line sense amplifier, according to the prior art.

FIG. 9 shows that the acceptable range of ΔVTN for the BLSA 200 of FIG. 3 is 120 mV (milli-Volt) and that the acceptable range of ΔVTN for the conventional BLSA 100 of FIG. 1 is 76 mV. In addition, FIG. 9 shows that the acceptable range of ΔVTP for the BLSA 200 of FIG. 3 is 126 mV and that the acceptable range of ΔVTP for the conventional BLSA 100 of FIG. 1 is greater than 200 mV.

In the conventional BLSA 100 of FIG. 1, the NMOSFET MN3 is turned on by the control signal LANG more quickly than the PMOSFET MP3 turning on by the control signal LAPG since an NMOSFET is generally faster than a PMOSFET. Thus, the effect of the threshold voltage variation ΔVTP between the PMOSFETs MP1 and MP2 is minimal in the conventional BLSA 100 of FIG. 1. Accordingly, the acceptable range of ΔVTP for the conventional BLSA 100 of FIG. 1 is greater than for the BLSA 200 of FIG. 3.

The BLSA 200 of FIG. 3 has a higher acceptable range ΔVTN of NMOSFET threshold voltage mismatch than for the conventional BLSA 100 of FIG. 1 because the respective voltages at the bit lines BL and BLB of the BLSA 200 of FIG. 3 begins at the meta-point MP at the end of the self pre-charge time period TP1. Such a meta-point MP accounts for the mismatches in the BLSA 200 of FIG. 3 including the threshold voltage mismatches. In contrast, the respective voltages at the bit lines BL and BLB of the BLSA 100 of FIG. 1 begins at ½ VDD without taking into account of any mismatches in the BLSA 100 at the end of pre-charging and equalizing time periods. Thus, the conventional BLSA 100 of FIG. 1 has a lower acceptable range ΔVTN of NMOSFET threshold voltage mismatch than for the BLSA 200 of FIG. 3.

Figure 13:
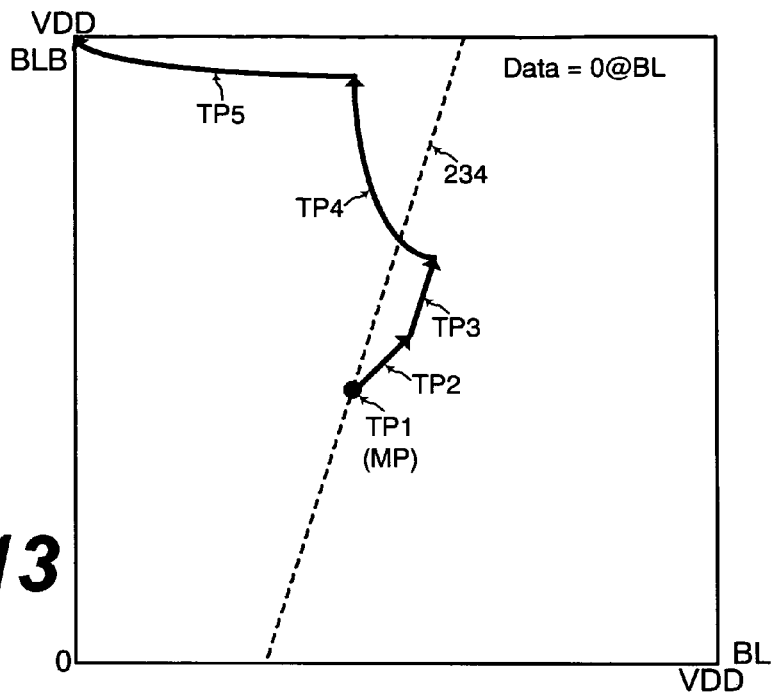
Figure 14:
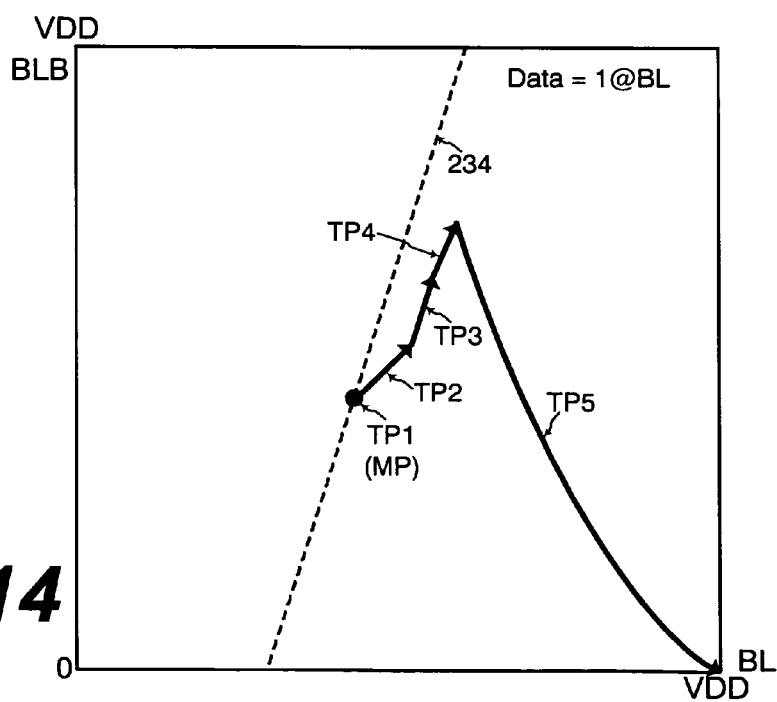

FIGS. 11 and 12 show state diagrams for the BLSA 200 of FIG. 3 with the meta-line 232 being for the ideal case of no mismatch between the bit-lines BL and BLB. FIGS. 13 and 14 show state diagrams for the BLSA 200 of FIG. 3 with a meta-line 234 being for a mismatch of loads between the bit-lines BL and BLB as illustrated in FIG. 10 for example. In FIG. 10, the first bit line BL has a first load capacitance C1, and the second bit line BLB has a second load capacitance C2 that is significantly lower than the first load capacitance C1.

Figure 4:
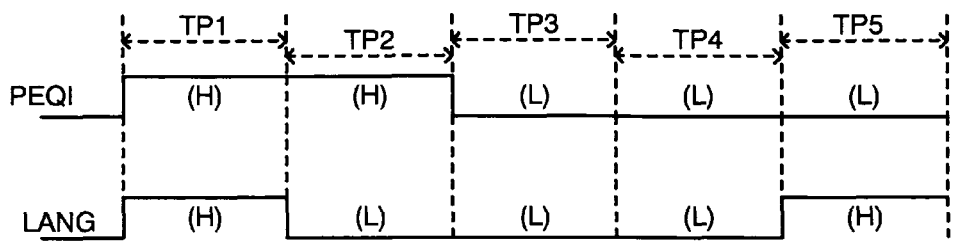
FIG. 4 shows a timing diagram of control signals generated during operation of the bit line sense amplifier of FIG. 3, according to an embodiment of the present invention.

In that case, the meta-line 234 in the state diagrams of FIGS. 13 and 14 has a higher slope than the meta-line 232 in the state diagrams of FIGS. 11 and 12. Referring to FIGS. 4, 6, and 10 while comparing FIGS. 11 and 13, the self pre-charging time period TP1 and the equalization time period TP2 are similar. However during the floating time period TP3 in FIG. 13, the voltages at the bit lines BL and BLB move along a line TP3 with the higher slope of the meta-line 234 in FIG. 13.

Thereafter during the charge sharing time period TP4 in FIG. 13, the respective voltage at the first bit line BL is decreased slightly while the respective voltage at the second bit line BLB is increased significantly because of the corresponding significantly lower second capacitance C2 and the PMOSFET action. Subsequently during the develop time period TP5 in FIG. 13, the respective voltage at the first bit line BL is decreased to 0 while the respective voltage at the second bit line is increased to VDD since the respective voltages at the bit lines BL and BLB are above the meta-line 234 at the end of the charge sharing time period TP4.

Referring to FIGS. 4, 6, and 10 while comparing FIGS. 12 and 14, the self pre-charging time period TP1 and the equalization time period TP2 are similar. However during the floating time period TP3 in FIG. 14, the respective voltages at the bit lines BL and BLB move along a line TP3 with the higher slope of the meta-line 234 in FIG. 14.

Thereafter during the charge sharing time period TP4 in FIG. 14, the respective voltage at first bit line BL is increased slightly, and the respective voltage at the second bit line BLB is also increased slightly because of the corresponding significantly lower second capacitance C2. Subsequently during the develop time period TP5 in FIG. 14, the respective voltage at the first bit line BL is increased to VDD while the respective voltage at the second bit line is decreased to 0 since the respective voltages at the bit lines BL and BLB are below the meta-line 234 at the end of the charge sharing time period TP4.

In this manner, the bit lines BL and BLB are pre-charged with current flowing through the field effect transistors MP11, MP12, MN11, and MN12 of the latching unit 202 for self pre-charge. In addition comparing FIGS. 1 and 3, the bit line bias voltage VBL and the high bias control signal LAPG are not used in the BLSA 200 of FIG. 3. Thus, voltage sources for generating such voltages VBL and LAPG are not needed in the BLSA 200 of FIG. 3.

Figure 2:
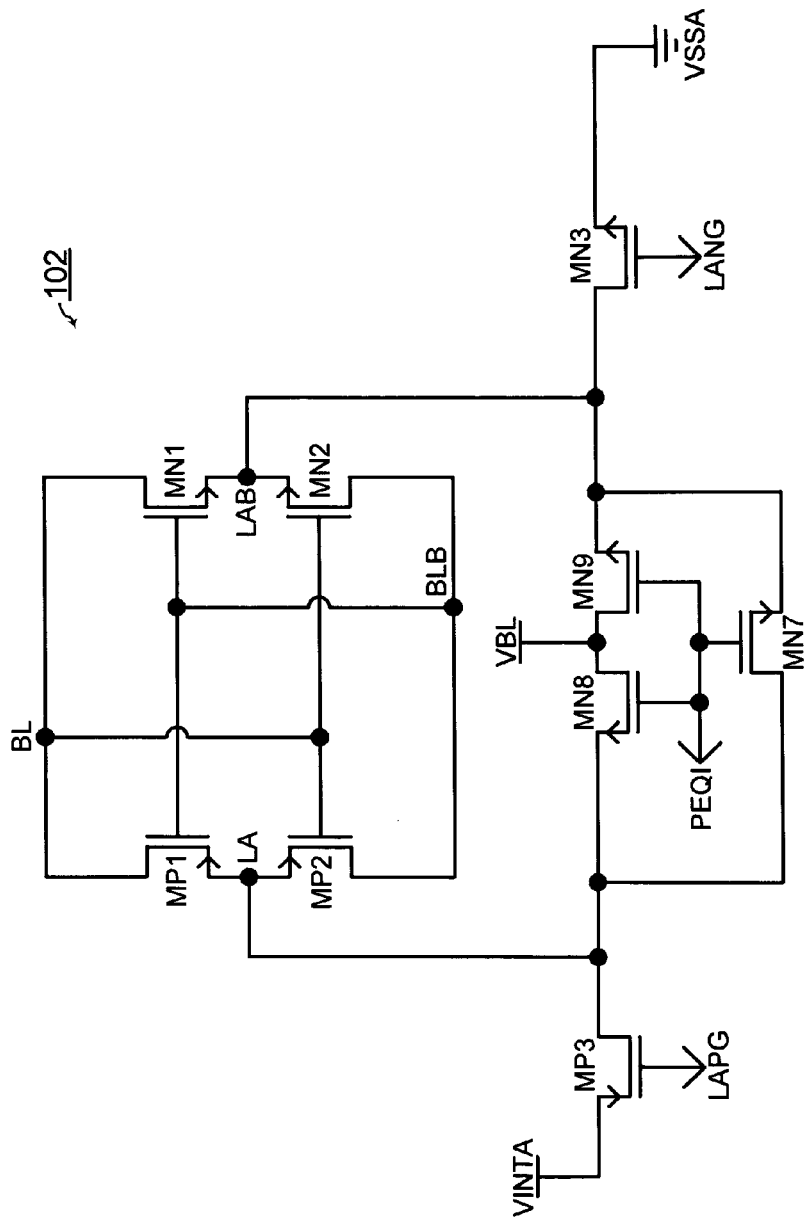
FIG. 2 shows a circuit diagram of a bit line sense amplifier with a different configuration of field effect transistors for pre-charge and equalization of bit lines from FIG. 1, according to the prior art.

Furthermore, the biasing PMOSFET MP3 controlled by the high bias control signal LAPG and the pre-charge NMOSFETs MN5 and MN6 in FIG. 1 or MN8 or MN9 of FIG. 2 are not present in the BLSA 200 of FIG. 3. Thus, a lower number of MOSFETs are connected between the high and low bias voltages VINTA and VSSA in the BLSA 200 of FIG. 3 that is amenable for low voltage operation and thus also low power operation. In addition, a lower number of MOSFETs are used to implement the BLSA 200 of FIG. 3.

By directly applying the high bias voltage VINTA to the sources of the PMOSFETs MP11 and MP12, the BLSA 200 of FIG. 3 operates faster than the BLSA 100 of FIG. 1 or 102 of FIG. 2. Furthermore, the PMOSFET action during the charge sharing time period TP4 increases ΔVBL (i.e., the difference between the voltages at the bit lines BL and BLB) for further increase of operating speed. In addition, by charging the bit lines BL and BLB according to the meta-point MP and the meta-line, the BLSA 200 of FIG. 3 has lower sensitivity to mismatch between the bit lines BL and BLB.

Figure 15:
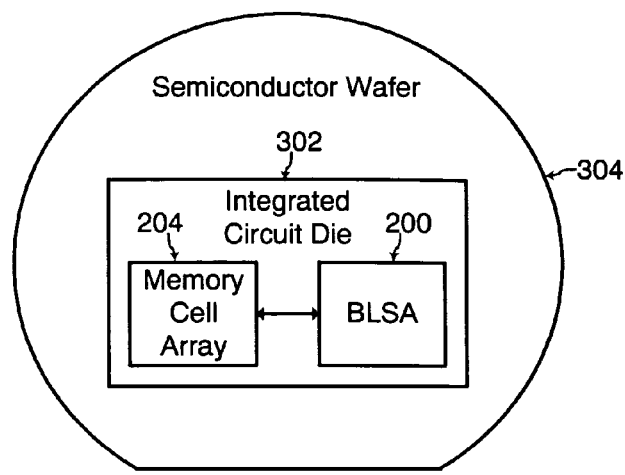
FIG. 15 shows a memory device with the memory cell array and the BLSA fabricated as an integrated circuit die on a semiconductor wafer, according to an example embodiment of the present invention.
Figure 16:
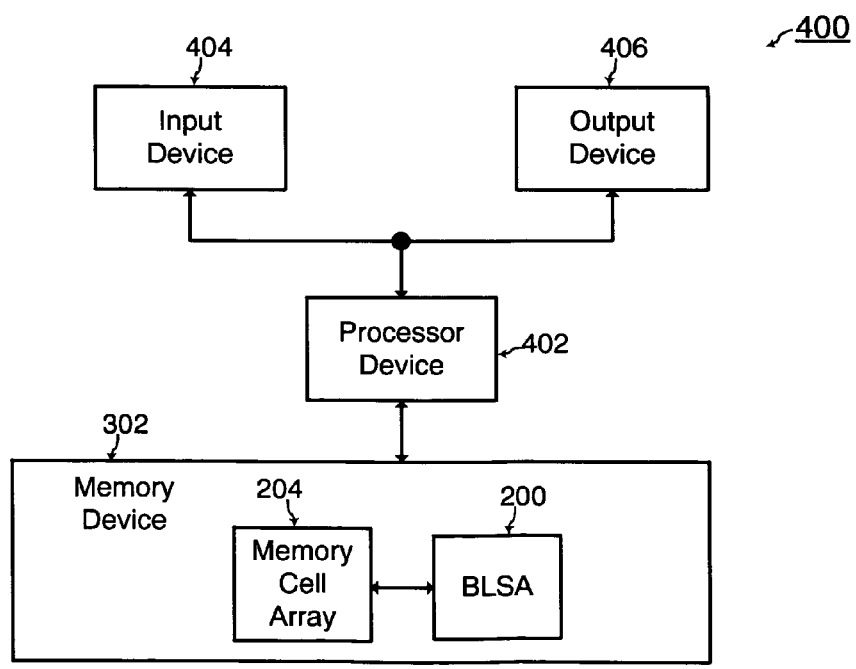
FIG. 16 shows an electronic system including the memory device, a data processor device, an input device, and an output device, according to an example embodiment of the present invention.

Referring to FIG. 15, the memory cell array 204 and the BLSA 200 are part of a memory device 302 such as a flash memory device for example that is fabricated as an integrated circuit die on a semiconductor wafer 304. Referring to FIG. 16, the memory device 302 is included as part of an electronic system 400 also having a data processor device 402, an input device 404, and an output device 406. The data processor device 402 is coupled to and controls the input device 404, the output device 406, and the memory device 302.

The foregoing is by way of example only and is not intended to be limiting. For example, any number of elements as illustrated and described herein is by way of example only. The present invention is limited only as defined in the following claims and equivalents thereof.

The invention claimed is:

1. A bit-line sense amplifier, comprising:
a latching unit having a plurality of field effect transistors coupled between first and second bit lines; and
a control unit for controlling application of a bias voltage to a set of said field effect transistors such that respective pre-charge voltages are generated at the first and second bit lines with drain currents flowing in said field effect transistors during a pre-charge time period,
wherein a high bias voltage is applied on sources of a first set of said field effect transistors, and wherein a bias switch is turned on during said pre-charge time period such that a low bias voltage is applied on sources of a second set of said field effect transistors, and wherein said drain currents flow through said field effect transistors and through nodes of said high and low bias voltages during said pre-charge time period.

2. The bit-line sense amplifier of claim 1, wherein the pre-charge time period is before sensing charge from a memory cell at one of the first and second bit lines.

3. The bit-line sense amplifier of claim 1, wherein the respective pre-charge voltages are generated at the first and second bit lines with only the high and low bias voltages applied at the sources of the field effect transistors of the latching unit and without any other voltage aside from the high and low voltages being applied on the latching unit during said pre-charge time period.

4. The bit-line sense amplifier of claim 1, further
wherein the bias switch is coupled between the node of the low bias voltage and said sources of the second set of said field effect transistors,
wherein the control unit controls the bias switch to be closed for having the low bias voltage applied at the sources of the second set field effect transistors during the pre-charge time period and for having said drain currents flow through said bias switch to said node of the low bias voltage during the pre-charge time period.

5. The bit-line sense amplifier of claim 4, wherein the bias switch is comprised of only one field effect transistor having a gate controlled by the control unit.

6. The bit-line sense amplifier of claim 4, wherein the low bias voltage is applied on the sources of the second set of the field effect transistors that are NMOSFETs (N-channel metal oxide semiconductor field effect transistors) through the bias switch.

7. The bit-line sense amplifier of claim 6, wherein the high bias voltage source is directly connected to the sources of two PMOSFETs (P-channel metal oxide semiconductor field effect transistors) of the latching unit,
and wherein the control unit controls application of a bias control signal on a gate of the bias switch.

8. The bit-line sense amplifier of claim 1, further comprising:
an equalization switch coupled between the first and second bit lines,
wherein the control unit controls the equalization switch to be closed between the first and second bit lines during the pre-charge time period.

9. The bit-line sense amplifier of claim 8, wherein the equalization switch is comprised of only one field effect transistor having a gate controlled by the control unit.

10. The bit-line sense amplifier of claim 8,
wherein the bias switch is coupled between the node of the low bias voltage and the sources of the second set of said field effect transistors,
wherein the control unit controls the bias switch to be closed for having the low bias voltage applied at the sources of the second set field effect transistors during the pre-charge time period and for having said drain currents flow through said bias switch to said node of the low bias voltage during the pre-charge time period.

11. The bit-line sense amplifier of claim 10, wherein the control unit controls the bias switch to be opened and the equalization switch to be closed during an equalization time period for generating respective equalized voltages at the first and second bit lines after the pre-charge time period, and wherein any other voltage aside from the high and low bias voltages is not applied on the latching unit during said pre-charge time period and said equalization time period.

12. The bit-line sense amplifier of claim 11, wherein the equalized voltages are limited by gate-to-source voltages of the first set of said field effect transistors.

13. The bit-line sense amplifier of claim 11, wherein the control unit controls the bias switch to be opened and the equalization switch to be opened during a floating time period after the equalization time period and before sensing charge from a memory cell at the first and second bit lines.

14. The bit-line sense amplifier of claim 13, wherein the control unit controls the bias switch to be opened and the equalization switch to be opened during a charge sharing time period for coupling of at least one memory cell to at least one of the first and second bit lines after the floating time period.

15. The bit-line sense amplifier of claim 14, wherein the control unit controls the bias switch to be closed and the equalization switch to be opened during a developing time period for generating data signals on the first and second bit lines after the charge sharing time period.

16. The bit-line sense amplifier of claim 15, wherein the bit-line sense amplifier has a state diagram with a meta-point and a meta-line, and wherein the meta-point determines the respective pre-charge voltages, and wherein the meta-line determines respective voltages at the bit lines during the floating time period.

17. A memory device comprising:
a memory cell array having at least one memory cell coupled to at least one of first and second bit lines; and
a bit-line sense amplifier including:
a latching unit having a plurality of field effect transistors coupled between the first and second bit lines; and
a control unit for controlling application of a bias voltage to a set of said field effect transistors such that respective pre-charge voltages are generated at the first and second bit lines with drain currents flowing in said field effect transistors during a pre-charge time period,
wherein a high bias voltage is applied on sources of a first set of said field effect transistors, and wherein a bias switch is turned on during said pre-charge time period such that a low bias voltage is applied on sources of a second set of said field effect transistors, and wherein said drain currents flow through said field effect transistors and through nodes of said high and low bias voltages during said pre-charge time period.

18. The memory device of claim 17, further comprising:
a decoder having the control unit formed therein with the decoder determining a memory cell to be coupled to one of the first and second bit lines from an address.

19. The memory device of claim 17, wherein the pre-charge time period is before sensing charge from the memory cell at the first and second bit lines.

20. The memory device of claim 17, wherein the respective pre-charge voltages are generated at the first and second bit lines with only the high and low bias voltages applied at the sources of the field effect transistors of the latching unit and without any other voltage aside from the high and low voltages being applied on the latching unit during said pre-charge time period.

21. The memory device of claim 18, wherein the
bias switch is coupled between the node of the low bias voltage and the sources of the second set of said field effect transistors,
and wherein the control unit controls the bias switch to be closed for having the low bias voltage applied at the sources of the second set of said field effect transistors during the pre-charge time period,
and wherein the bias switch is comprised of only one field effect transistor having a gate controlled by the control unit.

22. The memory device of claim 21, wherein the low bias voltage is applied on the sources of the second set of said field effect transistors that are NMOSFETs (N-channel metal oxide semiconductor field effect transistors) through the bias switch, and wherein the node of the high bias voltage is directly connected to the sources of two PMOSFETs (P-channel metal oxide semiconductor field effect transistors) of the latching unit, and wherein the control unit controls application of a bias control signal on the gate of the bias switch.

23. The memory device of claim 17, wherein the bit-line sense amplifier further includes:

an equalization switch coupled between the first and second bit lines, wherein the control unit controls the equalization switch to be closed between the first and second bit lines during the pre-charge time period, and wherein the equalization switch is comprised of only one field effect transistor having a gate controlled by the control unit.

24. The memory device of claim 23, wherein the bias switch is coupled between the node of the low bias voltage and the sources of the second set of said field effect transistors, and wherein the control unit controls the bias switch to be closed for having the low bias voltage applied at the sources of the second set of said field effect transistors during the pre-charge time period, and wherein the control unit controls the bias switch to be opened and the equalization switch to be closed during an equalization time period for generating respective equalized voltages at the first and second bit lines after the pre-charge time period, and wherein the control unit controls the bias switch to be opened and the equalization switch to be opened during a floating time period after the equalization time period and before sensing charge from the memory cell at the first and second bit lines, and wherein the control unit controls the bias switch to be opened and the equalization switch to be opened during a charge sharing time period for coupling the memory cell to at least one of the first and second bit lines after the floating time period, and wherein the control unit controls the bias switch to be closed and the equalization switch to be opened during a developing time period for generating data signals on the first and second bit lines after the charge sharing time period.

25. The memory device of claim 24, wherein the bit-line sense amplifier has a state diagram with a meta-point and a meta-line, and wherein the meta-point determines the respective pre-charge voltages, and wherein the meta-line determines respective voltages at the bit lines during the floating time period.

26. A method of sensing charge from a memory cell coupled to one of first and second bit lines, the method comprising:

decoupling the memory cell from the first and second bit lines during a pre-charge time period; and controlling application of a bias voltage to a set of field effect transistors of a latching unit coupled between the first and second bit lines such that respective pre-charge voltages are generated at the first and second bit lines with drain currents flowing in said field effect transistors during the pre-charge time period, wherein a high bias voltage is applied on sources of a first set of said field effect transistors, and wherein a bias switch is turned on during said pre-charge time period such that a low bias voltage is applied on sources of a second set of said field effect transistors, and wherein said drain currents flow through said field effect transistors and through nodes of said high and low bias voltages during said pre-charge time period.

27. The method of claim 26, further comprising:

generating the respective pre-charge voltages at the first and second bit lines with only the high and low bias voltages applied at the sources of the field effect transistors of the latching unit and without any other voltage aside from the high and low voltages being applied on the latching unit during said pre-charge time period.

28. The method of claim 26, further comprising:

controlling the bias switch, coupled between the node of the low bias voltage and the sources of the second set of said field effect transistors, to be closed for having the low bias voltage applied at the sources of the two field effect transistors during the pre-charge time period.

29. The method of claim 28, wherein the bias switch is comprised of only one field effect transistor having a gate that is controlled.

30. The method of claim 28, further comprising:

applying, through the bias switch, the low bias voltage on the sources of the two field effect transistors that are NMOSFETs (N-channel metal oxide semiconductor field effect transistors).

31. The method of claim 30, further comprising:

connecting directly the node of the high bias voltage source to the sources of two PMOSFETs (P-channel metal oxide semiconductor field effect transistors) of the latching unit; and controlling application of a bias control signal on a gate of the bias switch.

32. The method of claim 26, further comprising:

controlling an equalization switch to be closed between the first and second bit lines during the pre-charge time period.

33. The method of claim 32, wherein the equalization switch is comprised of only one field effect transistor having a gate that is controlled.

34. The method of claim 32, further comprising:

controlling the bias switch, coupled between the node of the low bias voltage and the sources of the second set of said field effect transistors, to be closed for having the low bias voltage applied at the sources of the second set field effect transistors during the pre-charge time period.

35. The method of claim 34, further comprising:

controlling the bias switch to be opened and the equalization switch to be closed during an equalization time period for generating respective equalized voltages at the first and second bit lines after the pre-charge time period, wherein any other voltage aside from the high and low voltages is not applied on the latching unit during said pre-charge time period and said equalization time period.

36. The method of claim 35, wherein the equalized voltages are limited by gate-to-source voltages of the first set of said field effect transistors.

37. The method of claim 35, further comprising:

controlling the bias switch to be opened and the equalization switch to be opened during a floating time period after the equalization time period and before sensing the charge from the memory cell at the first and second bit lines.

38. The method of claim 37, further comprising:

controlling the bias switch to be opened and the equalization switch to be opened during a charge sharing time period for coupling of the memory cell to one of the first and second bit lines after the floating time period.

39. The method of claim 38, further comprising:
controlling the bias switch to be closed and the equalization switch to be opened during a developing time period for generating data signals on the first and second bit lines after the charge sharing time period.

40. The method of claim 39, wherein the latching unit has a state diagram with a meta-point and a meta-line, and wherein the meta-point determines the respective pre-charge voltages, and wherein the meta-line determines respective voltages at the bit lines during the floating time period.

41. A method of sensing charge from a memory cell coupled to one of first and second bit lines, the method comprising:
generating respective pre-charge voltages determined by a meta-point of a latching unit at the first and second bit lines during a pre-charge time period, wherein a high bias voltage is applied on sources of a first set of field effect transistors forming the latching unit, and wherein a bias switch is turned on during said pre-charge time period such that a low bias voltage is applied on sources of a second set of field effect transistors further forming the latching unit, and wherein drain currents flow through said field effect transistors and through nodes of said high and low bias voltages during said pre-charge time period;
generating respective equalized voltages at the first and second bit lines during an equalization time period after the pre-charge time period; and
coupling at least one memory cell to at least one of the first and second bit lines during a charge sharing period after the equalization time period.

42. The method of claim 41, further comprising:
generating respective voltages at the first and second bit lines along a meta-line of the latching unit during a floating time period after the equalization time period and before the charge sharing period; and
generating data signals on the first and second bit lines after the charge sharing time period during a developing time period,
wherein any other voltage aside from the high and low voltages is not applied on the latching unit during said pre-charge time period and said equalization time period.

43. A semiconductor wafer including an integrated circuit comprising:
a memory cell array having at least one memory cell coupled to at least one of first and second bit lines; and
a bit-line sense amplifier including:
a latching unit having a plurality of field effect transistors coupled between the first and second bit lines; and
a control unit for controlling application of a bias voltage to a set of said field effect transistors such that respective pre-charge voltages are generated at the first and second bit lines with drain currents flowing in said field effect transistors during a pre-charge time period,
wherein a high bias voltage is applied on sources of a first set of said field effect transistors, and wherein a bias switch is turned on during said pre-charge time period such that a low bias voltage is applied on sources of a second set of field effect transistors, and wherein said drain currents flow through said field effect transistors and through nodes of said high and low bias voltages during said pre-charge time period.

44. The semiconductor wafer of claim 43, wherein the integrated circuit further comprises:
a decoder having the control unit formed therein with the decoder determining the memory cell to be coupled to one of the first and second bit lines from an address.

45. The semiconductor wafer of claim 43, wherein the bias switch is coupled between the node of the low bias voltage and the sources of the second set of said field effect transistors,
wherein the control unit controls the bias switch to be closed for having the low bias voltage applied at the sources of the second set of said field effect transistors during the pre-charge time period,
and wherein the bias switch is comprised of only one field effect transistor having a gate controlled by the control unit,
and wherein the low bias voltage is applied on the sources of the second set of said field effect transistors that are NMOSFETs (N-channel metal oxide semiconductor field effect transistors) through the bias switch,
and wherein the node of the high bias voltage is directly connected to the sources of two PMOSFETs (P-channel metal oxide semiconductor field effect transistors) of the latching unit,
and wherein the control unit controls application of a bias control signal on a gate of the bias switch; and
an equalization switch coupled between the first and second bit lines,
wherein the control unit controls the equalization switch to be closed between the first and second bit lines during the pre-charge time period,
and wherein the equalization switch is comprised of only one field effect transistor having a gate controlled by the control unit,
and wherein the control unit controls the bias switch to be opened and the equalization switch to be closed during an equalization time period for generating respective equalized voltages at the first and second bit lines after the pre-charge time period,
and wherein any other voltage aside from the high and low voltages is not applied on the latching unit during said pre-charge time period and said equalization time period,
and wherein the control unit controls the bias switch to be opened and the equalization switch (to be opened during a floating time period after the equalization time period and before sensing charge from the memory cell at the first and second bit lines,
and wherein the control unit controls the bias switch to be opened and the equalization switch to be opened during a charge sharing time period for coupling the memory cell to at least one of the first and second bit lines after the floating time period,
and wherein the control unit controls the bias switch to be closed and the equalization switch to be opened during a developing time period for generating data signals on the first and second bit lines after the charge sharing time period.

46. An electronic system including:
an input device;
an output device;
a memory device; and
a processor device coupled to the input device, the output device, and the memory device,
wherein the memory device includes:
a memory cell array having at least one memory cell coupled to at least one of first and second bit lines; and a bit-line sense amplifier including:
- a latching unit having a plurality of field effect transistors coupled between the first and second bit lines; and
- a control unit for controlling application of a bias voltage to a set of said field effect transistors such that respective pre-charge voltages are generated at the first and second bit lines with drain currents flowing in said field effect transistors during a pre-charge time period, wherein a high bias voltage is applied on sources of a first set of said field effect transistors, and wherein a bias switch is turned on during said pre-charge time period such that a low bias voltage is applied on sources of a second set of said field effect transistors, and wherein said drain currents flow through said field effect transistors and through nodes of said high and low bias voltages during said pre-charge time period.

47. The electronic system of claim 46, wherein the memory device further includes:
- a decoder having the control unit formed therein with the decoder determining the memory cell to be coupled to one of the first and second bit lines from an address.

48. The electronic system of claim 46, wherein the
bias switch is coupled between the node of the low bias voltage and the sources of the second set of said field effect transistors,
wherein the control unit controls the bias switch to be closed for having the low bias voltage applied at the sources of the second set of the field effect transistors during the pre-charge time period,
and wherein the bias switch is comprised of only one field effect transistor having a gate controlled by the control unit,
and wherein the low bias voltage is applied on the sources of the second set of the field effect transistors that are NMOSFETs (N-channel metal oxide semiconductor field effect transistors) through the bias switch,
and wherein the node of the high bias voltage is directly connected to the sources of two PMOSFETs (P-channel metal oxide semiconductor field effect transistors) of the latching unit, and wherein the control unit controls application of a bias control signal on a gate of the bias switch; and
an equalization switch coupled between the first and second bit lines,
wherein the control unit controls the equalization switch to be closed between the first and second bit lines during the pre-charge time period,
and wherein the equalization switch is comprised of only one field effect transistor having a gate controlled by the control unit,
and wherein the control unit controls the bias switch to be opened and the equalization switch to be closed during an equalization time period for generating respective equalized voltages at the first and second bit lines after the pre-charge time period,
and wherein any other voltage aside from the high and low voltages is not applied on the latching unit during said pre-charge time period and said equalization time period,
and wherein the control unit controls the bias switch to be opened and the equalization switch to be opened during a floating time period after the equalization time period and before sensing charge from the memory cell at the first and second bit lines,
and wherein the control unit controls the bias switch to be opened and the equalization switch to be opened during a charge sharing time period for coupling the memory cell to at least one of the first and second bit lines after the floating time period,
and wherein the control unit controls the bias switch to be closed and the equalization switch to be opened during a developing time period for generating data signals on the first and second bit lines after the charge sharing time period.

* * * * *